United States Patent
Chinthakindi et al.

(10) Patent No.: US 7,566,593 B2
(45) Date of Patent: Jul. 28, 2009

(54) FUSE STRUCTURE INCLUDING CAVITY AND METHODS FOR FABRICATION THEREOF

(75) Inventors: Anil K. Chinthakindi, Wappingers Falls, NY (US); Deok-kee Kim, Bedford Hills, NY (US); Chandrasekharan Kothandaraman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 11/538,170

(22) Filed: Oct. 3, 2006

(65) Prior Publication Data

US 2008/0079113 A1    Apr. 3, 2008

(51) Int. Cl.
*H01L 21/82* (2006.01)
(52) U.S. Cl. .................. 438/132; 438/215; 257/530
(58) Field of Classification Search ................ 438/131, 438/132, 215, 281, 467, 600, 601; 257/529, 257/530, E23.149, E21.592
See application file for complete search history.

(56) References Cited

U.S. PATENT DOCUMENTS

| | | | |
|---|---|---|---|
| 5,903,041 A | 5/1999 | La Fleur et al. | |
| 6,268,638 B1 | 7/2001 | Brintzinger et al. | |
| 6,274,440 B1 | 8/2001 | Arndt et al. | |
| 6,566,238 B2 * | 5/2003 | Brintzinger et al. | 257/529 |
| 6,633,055 B2 | 10/2003 | Bertin et al. | |
| 6,927,472 B2 | 8/2005 | Anderson et al. | |
| 2006/0038297 A1 | 2/2006 | Usami et al. | |

* cited by examiner

*Primary Examiner*—Thinh T Nguyen
(74) *Attorney, Agent, or Firm*—Scully, Scott, Murphy & Presser, P.C.; Lisa U. Jaklitsch

(57) ABSTRACT

A fuse structure comprises a cavity interposed between a substrate and a fuse material layer. The cavity is not formed at a sidewall of the fuse material layer, or at a surface of the fuse material layer opposite the substrate. A void may be formed interposed between the substrate and the fuse material layer while using a self-aligned etching method, when the fuse material layer comprises lobed ends and a narrower middle region. The void is separated by a pair of sacrificial layer pedestals that support the fuse material layer. The void is encapsulated to form the cavity by using an encapsulating dielectric layer. Alternatively, a block mask may be used when forming the void interposed between the substrate and the fuse material layer.

1 Claim, 11 Drawing Sheets

FUSE STRUCTURE INCLUDING CAVITY AND METHODS FOR FABRICATION THEREOF

BACKGROUND

1. Field of the Invention

The invention relates generally to fuses within microelectronic structures. More particularly, the invention relates to enhanced performance fuses within microelectronic structures.

2. Description of the Related Art

In addition to transistors, resistors, diodes and capacitors, semiconductor structures and semiconductor circuits often include fuses. Fuses within semiconductor structures are desirable insofar as fuses provide an efficient means for severing a portion of a semiconductor circuit that is otherwise defective and unoperational. In particular, fuses are often useful in severing defective portions of memory array circuits that are defective and unoperational.

Although fuses are essential within semiconductor circuit fabrication, fuses are nonetheless not entirely without problems. In particular, while providing a means for severing portions of a semiconductor circuit that is defective and unoperational, fuses may not under all circumstances themselves operate efficiently absent defects. In some instances, fuses do not always readily sever. In some other instances, fuses that are apparently severed may still allow flow of a reduced but nonetheless residual current.

Fuses and fuse structures are known in the semiconductor fabrication art.

For example, Arndt et al., in U.S. Pat. No. 6,274,440, teaches a fuse structure having greater operational reliability. This particular fuse structure comprises a fuse layer fabricated from a gate conductor stack within a semiconductor structure and located within a cavity within the semiconductor structure.

Semiconductor structure and device dimensions are certain to continue to decrease, and as a result thereof desirable are fuses and fuse structures that have enhanced reliability. Also desirable are methods for fabricating such fuses and fuse structures with enhanced reliability.

SUMMARY OF THE INVENTION

The invention provides a fuse structure and methods for fabricating the fuse structure. The fuse structure comprises a cavity (e.g., air gap) beneath a fuse material layer within the fuse structure. Given appropriate selection of materials for fabricating the fuse structure, the cavity may be formed in-part while using a self aligned etching method.

A fuse structure in accordance with the invention includes a fuse material layer separated from a substrate by a cavity. The cavity does not extend to a side of the fuse material layer opposite the substrate.

A method for forming a fuse structure in accordance with the invention includes forming a laminated structure comprising a substrate layer, a sacrificial layer formed upon the substrate layer and a fuse material layer formed upon the sacrificial layer. The method also includes etching the sacrificial layer to form a pair of sacrificial layer pedestals supporting a pair of ends of the fuse material layer. The method also further includes forming an encapsulating dielectric layer over the fuse material layer and the sacrificial layer pedestals to form a cavity interposed between the fuse material layer and the substrate layer.

Another method for forming a fuse structure in accordance with the invention also includes forming a laminated structure comprising a substrate layer, a sacrificial layer formed upon the substrate layer and a fuse material layer formed upon the sacrificial layer. This particular method also includes masking a pair of ends of the fuse material layer. This particular method also includes etching the sacrificial layer to form a pair of sacrificial layer pedestals at the pair of ends of the fuse material layer. Finally, this particular method also includes forming an encapsulating dielectric layer over the fuse material layer and the sacrificial layer pedestals to form a cavity interposed between the fuse material layer and the substrate layer.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The invention, which comprises a fuse structure and methods for fabricating the fuse structure, is disclosed in further detail below within the context of the drawings described above. Since the drawings are intended for illustrative purposes, the drawings are not necessarily drawn to scale.

FIG. 1 to FIG. 9 show a series of schematic cross-sectional and plan-view diagrams illustrating the results of progressive stages in fabricating a fuse structure in accordance an embodiment of the invention. This embodiment of the invention, which comprises the fuse structure and a method for fabricating the fuse structure, comprises a first embodiment of the invention.

Figure 1:
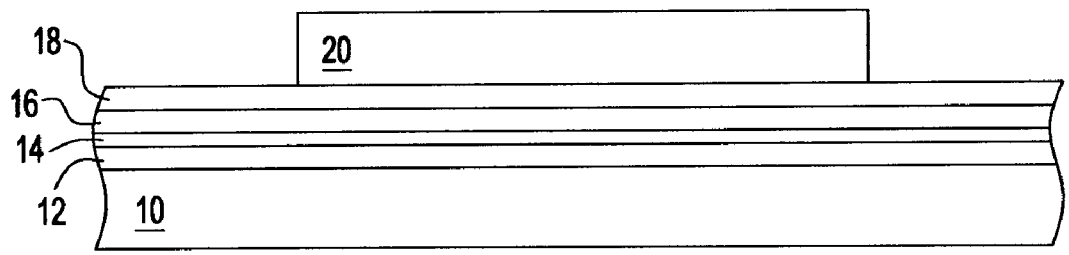
FIG. 1 to FIG. 9 show a series of schematic cross-sectional and plan-view diagrams illustrating the results of progressive stages in fabricating a fuse structure in accordance with an embodiment of the invention.

FIG. 1 shows a substrate 10 in which a substrate layer 12 is located upon the substrate 10, and a sacrificial layer 14 is located upon the substrate layer 12. A fuse material layer 16 is located upon the sacrificial layer 14 and a capping layer 18 is located upon the fuse material layer 16. A mask layer 20 is located upon the capping layer 18.

Each of the foregoing substrate 10 and overlying layers 12, 14, 16, 18 and 20 may comprise materials and have dimensions that are conventional in the semiconductor fabrication art. Each of the foregoing substrate 10 and overlying layers 12, 14, 16, 18 and 20 may be formed using methods that are conventional in the semiconductor fabrication art.

The substrate 10 may comprise one or more materials selected from the group including, but not limited to, conductor materials, semiconductor materials and dielectric materials. As will be illustrated within the context of a more specifically implemented embodiment that is further discussed below, the substrate 10 typically comprises at least in part a semiconductor material, typically in the form of a semiconductor substrate. Further, such a semiconductor substrate will typically also comprise semiconductor devices, such as, but not limited to, transistors, resistors, diodes and capacitors.

Each of the substrate layer 12 (which may be optional within the instant embodiment, dependent upon materials of fabrication of the substrate 10), the sacrificial layer 14 and the capping layer 18 will typically comprise dielectric materials. However, the sacrificial layer 14 may alternatively comprise other materials (i.e., such as conductor materials and semiconductor materials) provided that appropriate etch selectivity properties are controlled with respect to the foregoing layers 12, 14, 16 and 18, as will be illustrated in further detail below.

Candidate dielectric materials for the substrate layer 12, the sacrificial layer 14 and the capping layer 18 may be selected from the group including, but not limited to, oxides, nitrides and oxynitirides of silicon. Oxides, nitrides and oxynitrides of other elements are not excluded. Also included as candidate dielectric materials for the substrate layer 12, the sacrificial layer 14 and the capping layer 18 are various silicon containing dielectric materials that may also comprise a carbon dopant or a hydrogen dopant.

Typically, the substrate layer 12 and the capping layer 18 comprise the same dielectric material, although the instant embodiment is not so limited. Similarly, for reasons that will become clearer within the context of further description below, the sacrificial layer 14 comprises a different dielectric material that has different etch selectivity properties in comparison with the substrate layer 12 and the capping layer 18.

Each of the substrate layer 12, the sacrificial layer 14 and the capping layer 18 may be formed using methods that are conventional in the semiconductor fabrication art. Non-limiting examples include thermal or plasma oxidation or nitridation methods, chemical vapor deposition methods (including atomic layer chemical vapor deposition methods) and physical vapor deposition methods (including sputtering methods).

The substrate layer 12 advantageously comprises a carbon doped silicon nitride material (i.e., SiCN) with a thickness from about 300 to about 500 angstroms. Similarly, the sacrificial layer 14 advantageously comprises a carbon and hydrogen doped silicon oxide material (i.e., SiCOH), a commonly used low dielectric constant (low-k) material with a thickness from about 200 to about 700 angstroms. Finally, the capping layer 18 also advantageously comprises the carbon doped silicon nitride material (i.e., SiCN) with a thickness from about 300 to about 500 angstroms.

The fuse material layer 16 may comprise any of several fuse materials. Non-limiting examples include tantalum, titanium and tungsten fuse materials, as well as tantalum nitride, tungsten nitride and titanium nitride fuse materials. The fuse materials may be deposited using any of several methods that are conventional in the semiconductor fabrication art. Non-limiting examples include chemical vapor deposition methods (including atomic layer chemical vapor deposition methods) and physical vapor deposition methods (including sputtering methods), in conjunction with thermal or plasma nitridation methods. Typically, the fuse material layer 16 comprises a tantalum nitride fuse material that has a thickness from about 300 to about 700 angstroms.

The mask layer 20 may comprise any of several mask materials. Included, but not limiting, are hard mask materials, as well as photoresist mask materials. Non-limiting examples of photoresist mask materials include positive photoresist materials, negative photoresist materials and hybrid photoresist materials. The mask layer 20 may be formed using any of several methods that are conventional in the semiconductor fabrication art, dependent upon the materials of composition of the mask layer 20. Photoresist mask materials will typically be deposited using spin-coating methods. Hard mask materials will typically be formed using chemical vapor deposition methods or physical vapor deposition methods. Typically, the mask layer 20 comprises a positive photoresist material or a negative photoresist material that has a thickness from about 2000 to about 5000 angstroms.

Figure 2:
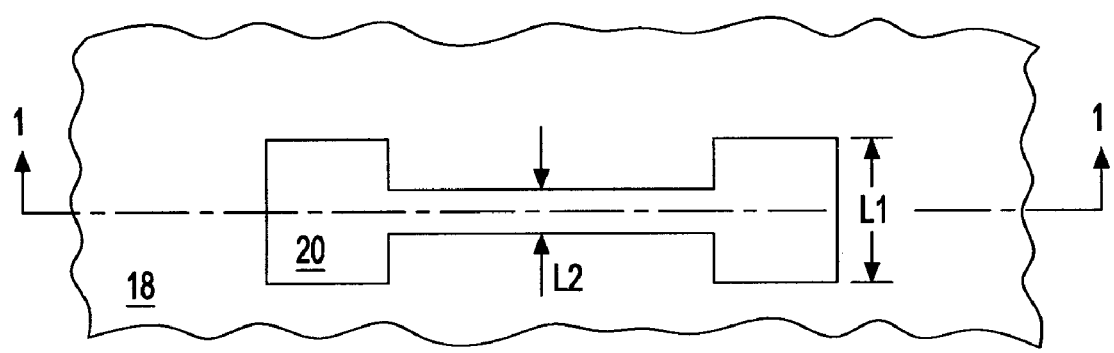

FIG. 2 shows a schematic plan-view diagram corresponding with the fuse structure whose schematic cross-sectional diagram is illustrated in FIG. 1.

FIG. 2 shows the mask layer 20 located upon the capping layer 18. As is illustrated within FIG. 2, the mask layer 20 comprises a "dog bone" shape that has lobed ends that are wider than a central portion that separates the lobed ends. Typically, the lobed ends have a linewidth L1 from about 5 to about 20 microns and the central portion has a linewidth L2 from about 0.1 to about 1 microns.

Figure 3:
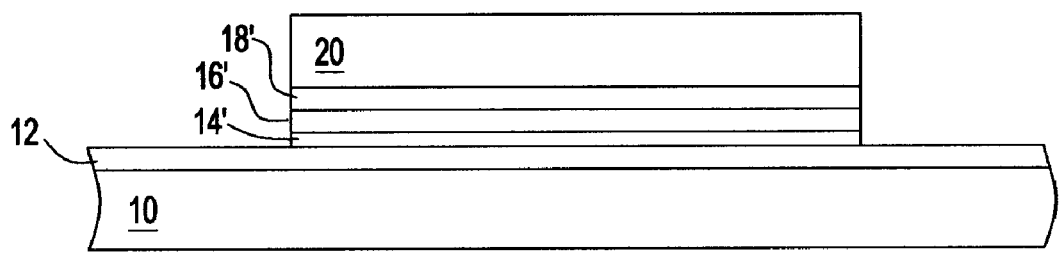

FIG. 3 shows the results of sequentially etching the capping layer 18, the fuse material layer 16 and the sacrificial layer 14 while using the mask layer 20 as an etch mask layer, and while using the substrate layer 12 as an etch stop layer. Resulting from the foregoing etching is: (1) a sacrificial layer 14', (2) a fuse material layer 16' located aligned upon the sacrificial layer 14'; and (3) a capping layer 18' located aligned upon the fuse material layer 16'.

The foregoing etching may be undertaken using methods and materials that are conventional in the semiconductor fabrication art. Non-limiting examples include wet chemical etching methods and materials, as well as dry plasma etching methods and materials. Dry plasma etching methods and materials are generally preferred insofar as dry plasma etching methods typically provide substantially straight sidewalls to the capping layer 18', the fuse material layer 16' and the sacrificial layer 14'. Certain wet chemical etch methods may also be used.

Figure 4:
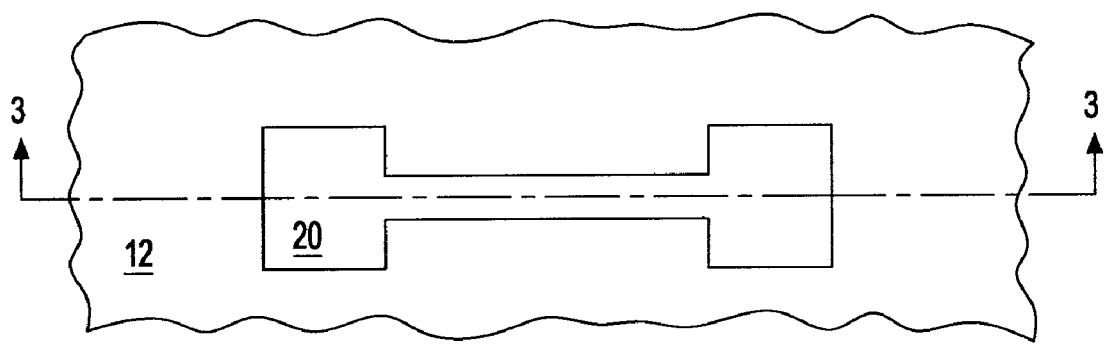

FIG. 4 shows a schematic plan-view diagram corresponding with the schematic cross-sectional diagram of FIG. 3. Specifically, FIG. 4 shows the mask layer 20 located over the substrate layer 12.

Figure 5:
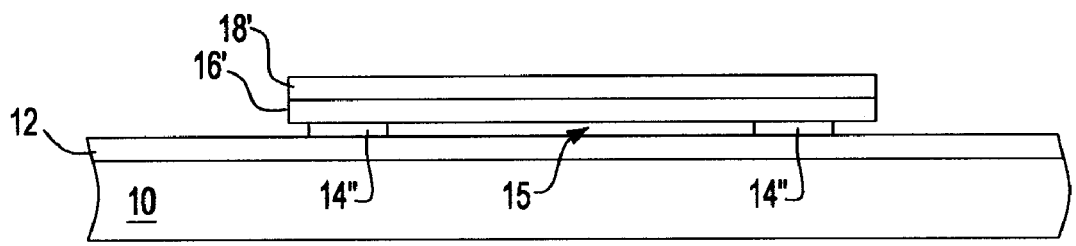

FIG. 5 first shows the results of stripping the mask layer 20 from the capping layer 18' within the fuse structure of FIG. 3. The mask layer 20 may be stripped using methods and materials that are otherwise generally conventional in the semiconductor fabrication art. Non-limiting examples include wet chemical stripping methods, dry plasma stripping methods and aggregate stripping methods thereof.

FIG. 5 also shows the results of etching the sacrificial layer 14' and undercutting the sacrificial layer 14' beneath the fuse material layer 16' to provide a pair of sacrificial layer pedestals 14" that support the fuse material layer 16' at a pair of contact region ends of the fuse material layer 16'. The pair of sacrificial layer pedestals 14" is separated by a void 15 beneath the fuse material layer 16'. Thus, within the instant embodiment, a central portion of the sacrificial layer 14' is etched completely away.

Advantageously within the instant embodiment: (1) the mask layer 20 (when comprised of a photoresist mask material) may be stripped; and (2) the sacrificial layer 14' (when comprised of a carbon and hydrogen doped silicon oxide material) may be etched to provide the sacrificial layer pedestals 14", sequentially within a single process sequence. Such a single process sequence may include, but is not necessarily limited to: (1) a dry plasma etch method using an oxygen containing etchant gas composition (for stripping the mask layer 20 and oxidizing carbon and hydrogen dopant materials within the sacrificial layer 14'); followed by (2) a wet chemical etch method using a hydrofluoric acid etchant material for removing oxidized portions of the sacrificial layer 14', while leaving the sacrificial layer pedestals 14" within the structure.

As noted above, within the foregoing two-step etch method, the oxygen containing plasma is intended primarily to strip the mask layer 20 (when comprised of a photoresist material), but the oxygen containing plasma also oxidizes portions of the sacrificial layer 14' when the sacrificial layer 14' comprises a carbon and hydrogen doped silicon oxide material. A carbon doped silicon nitride material that may be used for forming the substrate layer 12 and the capping layer 18' may also be susceptible to further oxidation within an oxygen containing plasma. Subsequent to oxygen containing plasma oxidation of the sacrificial layer 14', a hydrofluoric acid etchant material may effectively remove and undercut oxygen containing plasma oxidized portions of the sacrificial layer 14' to form the sacrificial layer pedestals 14". A further oxidized carbon doped silicon nitride material is typically not susceptible to etching with a hydrofluoric acid etchant, due to the nitrogen content thereof.

Within the context of the foregoing disclosure, the oxygen containing plasma oxidation used primarily for stripping the mask layer 20 uses: (1) more than 100 standard cubic centimeters per minute (sccm) oxygen ($O_2$) flow; and (2) a radio frequency (RF) power of more than 200 W Similarly, the dilute hydrofluoric acid etchant uses less than 0.1M concentration.

Figure 6:
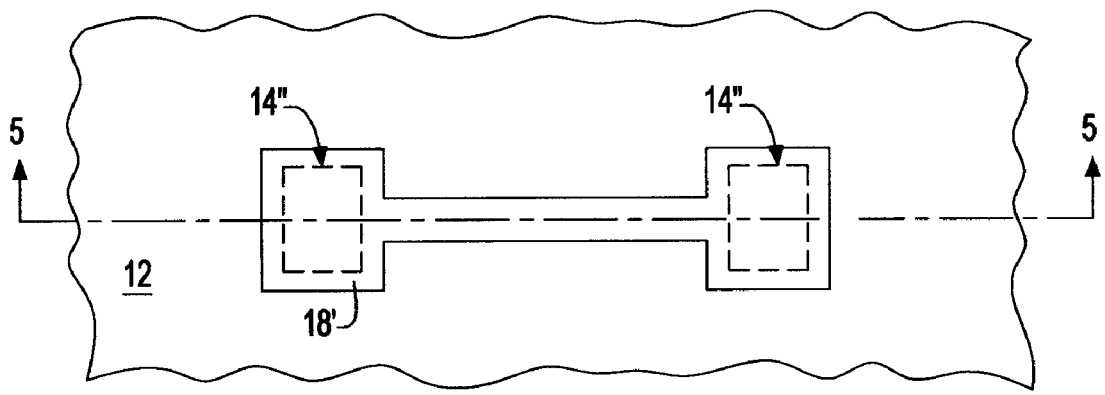

FIG. 6 shows a schematic plan-view diagram that corresponds with FIG. 5. Specifically, FIG. 6 shows the substrate layer 12 and the capping layer 18', as well as outlines of the sacrificial layer pedestals 14".

Figure 7:
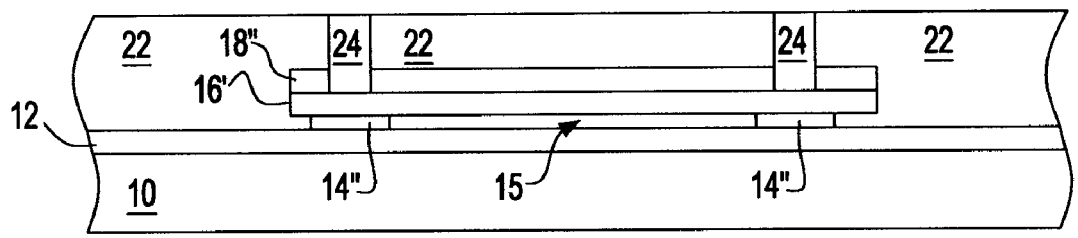

FIG. 7 first shows an encapsulating dielectric layer 22 located upon the fuse structure of FIG. 5. FIG. 7 also shows a pair of contact studs 24 penetrating through the encapsulating dielectric layer 22, as well as penetrating through a dielectric capping layer 18" that results from further patterning of the dielectric capping layer 18'. The contact studs 24 contact the fuse material layer 16' at contact region portions thereof over the sacrificial layer pedestals 14".

The encapsulating dielectric layer 22 may comprise a dielectric material selected from the same group of dielectric materials from which may be formed the capping layer 18, the sacrificial layer 14 and the substrate layer 12 that are illustrated in FIG. 1. Typically, the encapsulating dielectric layer 22 comprises the same material as the sacrificial layer 14, when the sacrificial layer 14 comprises a dielectric material. Thus, the encapsulating dielectric layer 22 typically comprises a carbon and hydrogen doped silicon oxide material. Typically, the encapsulating dielectric layer 22 has a thickness from about 3000 to about 5000 angstroms.

The contact studs 24 may comprise any of several conductor materials. Non-limiting examples include certain metals, metal alloys, metal nitrides and metal silicides. Also included are doped polysilicon materials and polycide materials (i.e., doped polysilicon/metal silicide stack materials). Tungsten, copper and aluminum are particularly common conductor materials for contact studs. Use of particular conductor materials for contact studs will often be dictated upon a location within a semiconductor structure where a fuse structure is intended to be fabricated.

Figure 8:
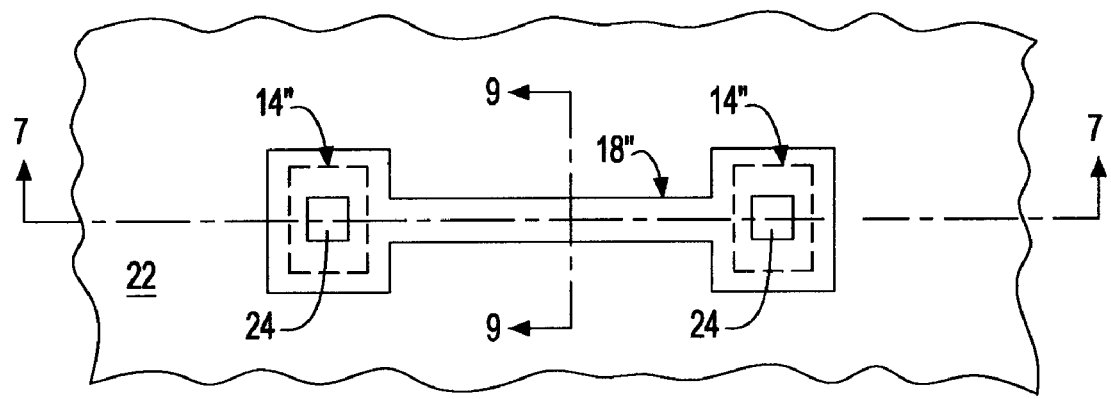

FIG. 8 shows a schematic plan-view diagram corresponding with FIG. 7. Specifically, FIG. 8 shows the encapsulating dielectric layer 22 with the pair of contact studs 24 penetrating through the encapsulating dielectric layer 22. Outlines of the capping layer 18' and the sacrificial layer pedestals 14" are illustrated within the schematic plan-view diagram of FIG. 8.

Figure 9:
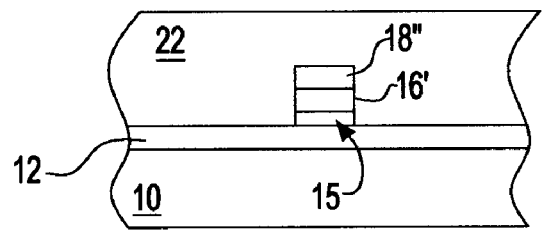

FIG. 9 shows an additional cross-sectional diagram, the location of which cross-section is illustrated in FIG. 8. FIG. 9 shows the substrate 10, as well as the optional substrate layer 12 that is located upon the substrate 10. FIG. 9 also shows the fuse material layer 16' with the capping layer 18" located upon the fuse material layer 16'. The encapsulating dielectric layer 22 is located upon the capping layer 18" and completes sidewalls of a cavity 15' that encloses the void 15 that is located beneath the fuse material layer 16'.

FIG. 7 to FIG. 9 show a series of schematic cross-sectional and plan-view diagrams illustrating a fuse structure in accordance with an embodiment (i.e., a fuse structure and a method for fabricating the fuse structure) of the invention that comprises a first embodiment of the invention.

The fuse structure comprises a cavity 15' interposed between a substrate 10/12 (i.e., substrate 10 and optional substrate layer 12) and the fuse material layer 16'. The cavity 15' is enclosed by an encapsulating dielectric layer 22. The cavity 15' does not extend to the sidewalls of the fuse material layer 16' or to an opposite side of the fuse material layer 16' (i.e., the side of the fuse material layer 16' to which is laminated the capping layer 18"). The cavity 15' provides for enhanced performance of the fuse structure in accordance with the embodiment, which comprises the fuse material layer 16'. Due to the presence of the cavity 15', the fuse material layer 16' is better isolated thermally and thus may be more reliably severed. In addition, the cavity 15' allows for less entrapment of fuse material layer 16' debris when the fuse material layer 16' is severed. Thus, the fuse structure in accordance with the invention provides for reduced residual current after severing the fuse material layer 16' in accordance with the instant embodiment.

FIG. 10 to FIG. 15 show a series of schematic cross-sectional and plan-view diagrams illustrating the results of progressive stages in fabricating the fuse structure in accordance with another methodological embodiment of the invention. This other methodological embodiment comprises a second embodiment of the invention.

Figure 10:
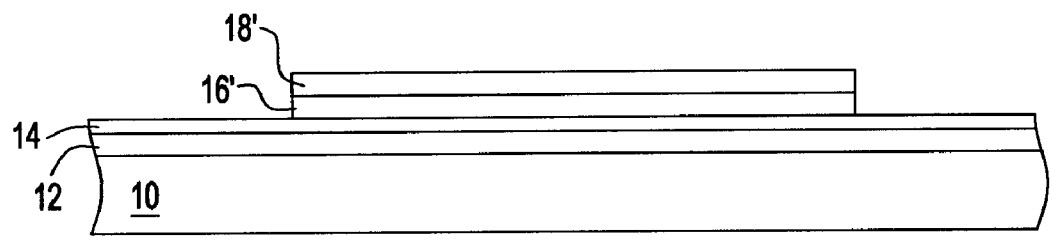
FIG. 10 to FIG. 15 show a series of schematic cross-sectional and plan-view diagrams illustrating the results of progressive stages in fabricating the fuse structure in accordance with another embodiment of the invention.

FIG. 10 shows a fuse structure generally related to the fuse structure of FIG. 3, but in a first instance absent the mask layer 20. FIG. 10 also differs from FIG. 3 insofar as the sacrificial layer 14 in FIG. 10 has not been etched to form the sacrificial layer 14' that is illustrated in FIG. 3.

Figure 11:
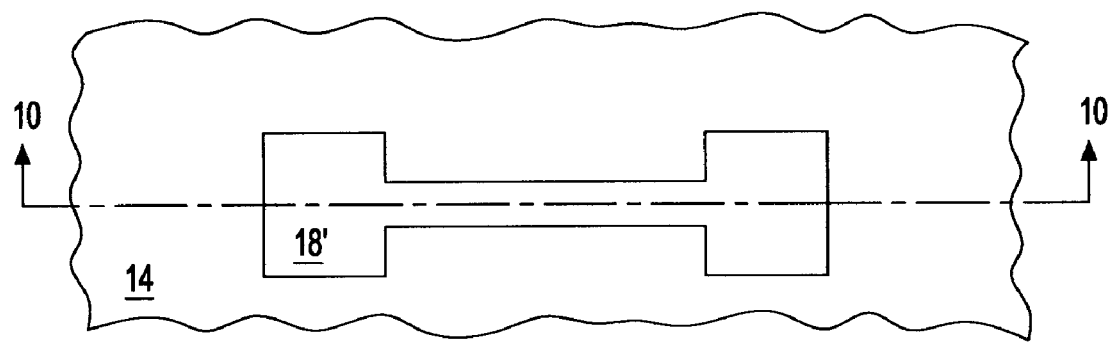

FIG. 11 shows a schematic plan-view diagram that corresponds with FIG. 10. FIG. 11 illustrates the capping layer 18' located over exposed portions of the sacrificial layer 14.

Figure 12:
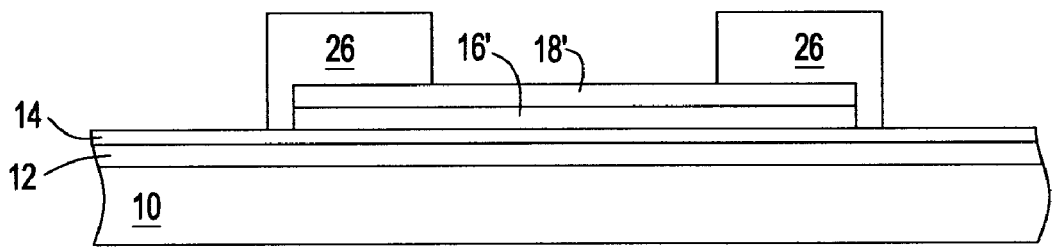

FIG. 12 shows a pair of block masks 26 located upon opposite ends of the capping layer 18' and also covering the sidewalls of the capping layer 18' and the fuse material layer 16'.

Figure 13:
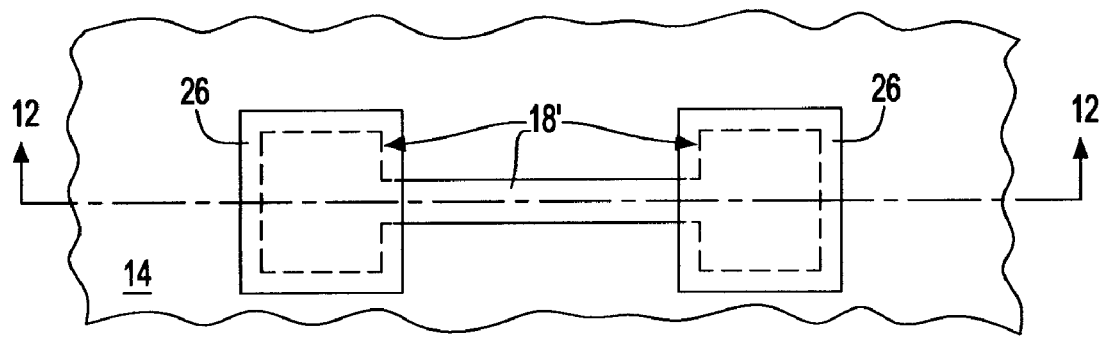

FIG. 13 more particularly illustrates the pair of block masks 26 as located covering the lobe shaped contact pad ends of the capping layer 18' and the fuse material layer 16' aligned beneath the capping layer 18'.

The block masks 26 may comprise any of several block mask materials. Included are hard mask materials as well as photoresist mask materials. Photoresist mask materials are generally more common. Typically, the block masks 26 have a thickness from about 2000 to about 5000 angstroms.

Figure 14:
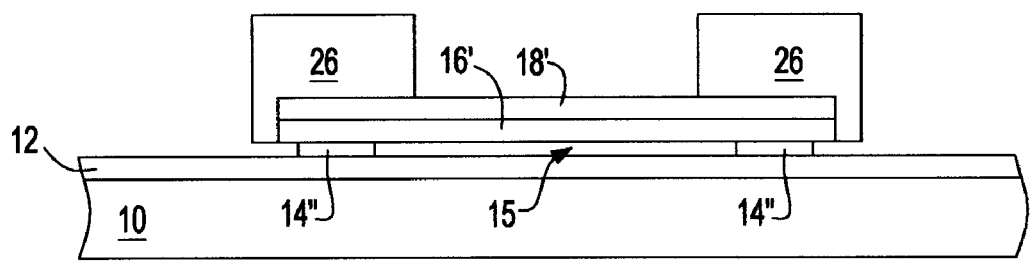
Figure 15:
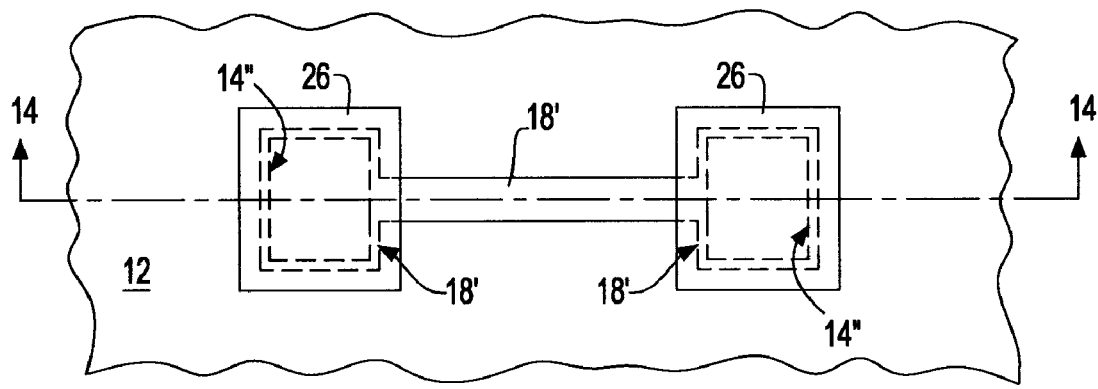

FIG. 14 and FIG. 15 show a schematic cross-sectional diagram and a schematic plan-view diagram illustrating the results of further processing of the fuse structure whose schematic cross-sectional diagram and schematic plan-view diagram are illustrated in FIG. 12 and FIG. 13.

FIG. 14 in particular illustrates the results of etching the sacrificial layer 14 while using the block masks 26 as an etch mask, to provide a pair of sacrificial layer pedestals 14" that support the fuse material layer 16'. Similarly with the first embodiment, a void 15 is formed beneath the fuse material layer 16'.

The fuse structure of FIG. 14 and FIG. 15 may be further fabricated in accordance with the schematic cross-sectional and plan-view diagrams of FIG. 7 to FIG. 9 (i.e., addition of the encapsulating dielectric layer 22) to form a fuse structure with characteristics and properties similar to those of the first embodiment. The characteristics and properties primarily include the cavity 15' beneath but not otherwise surrounding (i.e., not at a sidewall surface or at a top surface of) the fuse material layer 16'.

FIG. 16 to FIG. 21 show a series of schematic cross-sectional diagrams illustrating the results of progressive stages in fabricating a semiconductor structure in accordance with yet another embodiment of the invention. This embodiment of the invention comprises a third embodiment of the invention. This third embodiment illustrates incorporation of the fuse structure of the first embodiment or the second embodiment into the semiconductor structure incident to use of a method in accordance with the first embodiment.

Figure 16:
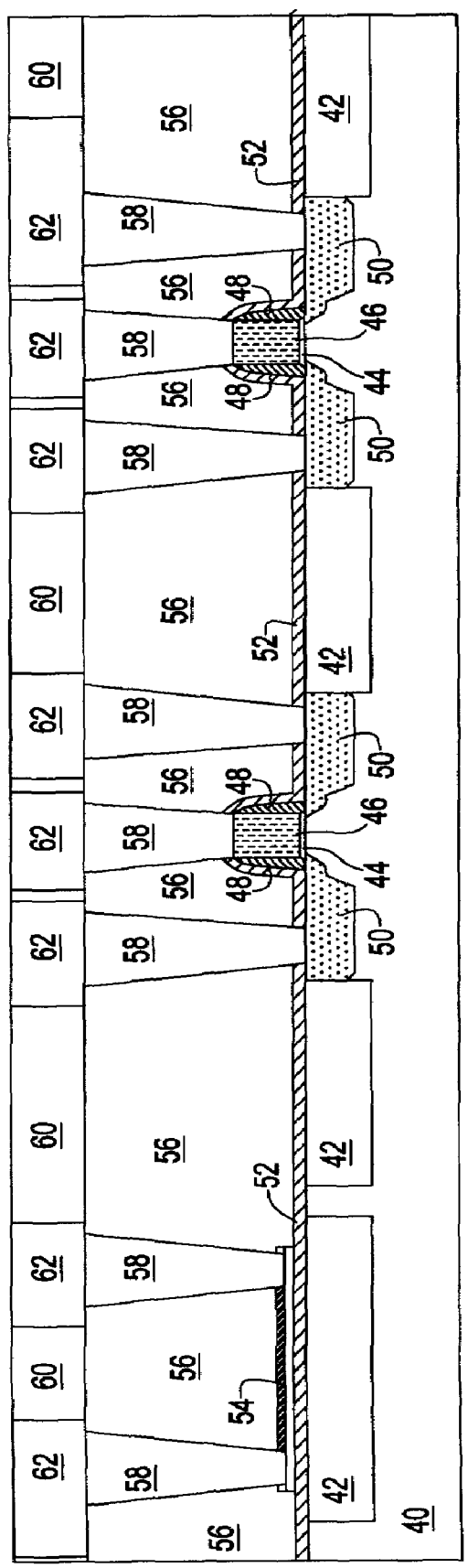
FIG. 16 to FIG. 21 show a series of schematic cross-sectional diagrams illustrating integration of the fuse structure into a semiconductor structure.

FIG. 16 shows a semiconductor substrate 40. A plurality of isolation regions 42 is located within semiconductor substrate 40 to separate a plurality of active regions within the semiconductor substrate 40. A pair of transistors T is located within the active regions separated by the isolation regions 42. A capping layer 52 caps the transistors T, and the capping layer 52 also serves as a base for a resistor 54 located over one particular isolation region 42.

The semiconductor substrate 40, and remaining structures designated above, may comprise materials and have dimensions that are conventional in the semiconductor fabrication art. The semiconductor substrate 40, and remaining structures designated above, may also be formed using methods that are conventional in the semiconductor fabrication art.

The semiconductor substrate 40 comprises a semiconductor material. Non-limiting examples of semiconductor materials include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials.

The semiconductor substrate 40 may comprise a bulk semiconductor material as is generally illustrated within the schematic cross-sectional diagram of FIG. 16. Alternatively, the semiconductor substrate 40 may comprise a semiconductor-on-insulator substrate or a hybrid orientation substrate. A semiconductor-on-insulator substrate comprises a base semiconductor substrate, a buried dielectric layer located thereupon and a surface semiconductor layer located further thereupon. A hybrid orientation substrate comprises multiple semiconductor regions having different crystallographic orientations. Semiconductor-on-insulator substrates and hybrid orientation substrates may be formed using any of several methods. Non-limiting examples include layer transfer methods, other laminating methods and separation by implantation of oxygen (SIMOX) methods.

The isolation regions 42 comprise isolation materials that are typically dielectric isolation materials. The dielectric isolation materials may comprise any of several dielectric materials. Non-limiting examples of dielectric materials include oxides, nitrides and oxynitrides of silicon. Oxides, nitrides and oxynitrides of other elements are not excluded. Also contemplated are laminates and composites of the foregoing dielectric isolation materials. Similarly, the dielectric isolation materials may also be crystalline materials or non-crystalline materials.

The isolation regions 42 may be formed using any of several methods. Non-limiting examples include thermal or plasma oxidation or nitridation methods, chemical vapor deposition methods (including atomic layer chemical vapor deposition methods) and physical vapor deposition methods (including sputtering methods) Typically, the isolation regions 42 comprise at least in part a silicon oxide dielectric material that has a thickness (i.e., trench depth) from about 2000 to about 6000 angstroms.

Each of the transistors T comprises a gate dielectric 44. A gate electrode 46 is located upon the gate dielectric 44. A spacer layer 48 (a singular layer in plan-view, but illustrated as plural layers in cross-sectional view) adjoin sidewalls of the gate electrode 46. A pair of source/drain regions 50 is located within the semiconductor substrate 40 and separated by a channel region beneath the gate electrode 46.

Each of the foregoing structures that comprise the transistors T may comprise materials and have dimensions that are conventional in the semiconductor fabrication art. Each of the foregoing structures that comprise the transistors T may be formed using methods that are conventional in the semiconductor fabrication art.

The gate dielectrics 44 may comprise generally conventional gate dielectric materials having a dielectric constant from about 4 to about 20, measured in vacuum. Non-limiting examples of these gate dielectric materials include silicon oxide, silicon nitride and silicon oxynitride gate dielectric materials. The gate dielectrics 44 may also comprise generally higher dielectric constant gate dielectric materials having a dielectric constant from about 20 to at least about 100, also measured in a vacuum. Non-limiting examples of these gate dielectric materials include hafnium oxides, hafnium silicates, titanium oxides, lanthanum oxides, barium-strontium titanates (BSTs) and lead-zirconate titanates (PZTs).

The gate dielectrics 44 may be formed using methods that are conventional in the semiconductor fabrication art and suitable to their materials of composition. Non-limiting examples include thermal or plasma oxidation or nitridation methods, chemical vapor deposition methods (including atomic layer chemical vapor deposition methods) and physical vapor deposition methods (including sputtering methods). Typically, the gate dielectrics 44 comprise a thermal silicon oxide gate dielectric material that has a thickness from about 10 to about 60 angstroms.

The gate electrodes 46 may similarly comprise gate electrode materials that are conventional in the semiconductor fabrication art. Included, but not limiting, are certain metals, metal alloys, metal nitrides and metal silicides. Also included, but not limiting, are doped polysilicon and polycide gate electrode materials. The gate electrode materials may be deposited using methods that are appropriate to their materials of composition. Non-limiting examples include plating methods, chemical vapor deposition methods and physical vapor deposition sputtering methods. Typically, the gate electrodes 46 comprise a metal gate material, a polycide gate material or a polysilicon gate material that has a thickness from about 1000 to about 2000 angstroms.

The spacer layers 48 (again, which are illustrated as plural layers in cross-section but are actually single layers that completely surround the gate electrodes 46 in plan view) typically comprise a dielectric spacer material, although conductor spacer materials are also known. Dielectric spacer materials may comprise the same materials as the isolation regions 42.

Conductor spacer materials may use the same materials as the gate electrodes 46. Typically, the spacers 48 comprise at least in part a dielectric spacer material. The spacers 48 are formed using a blanket layer deposition and anisotropic etchback method that is otherwise generally conventional in the semiconductor fabrication art.

The source/drain regions 50 comprise a dopant of polarity appropriate for a polarity of a transistor T desired to be formed. Typically, the source/drain regions 50 are formed using a two step ion implantation process. A first step within the two step ion implantation process uses the gate 46 absent the spacers 48 as a mask to form extension regions into the semiconductor substrate 40. A second step within the two step ion implantation process uses the gate electrode 46 and spacers 48 as a mask to form contact region portions of the source/drain regions 50 that incorporate the extension regions. Typically, the extension regions have a doping from about 1e15 to about 1e16 dopant atoms per cubic centimeter and the contact regions have a dopant concentration from about 1e18 to about 1e21 dopant atoms per cubic centimeter.

The capping layer 52 typically comprises a dielectric capping material. Dielectric capping materials may be selected from the same group of materials as the isolation regions 42. The dielectric capping materials may also be deposited using the same methods as disclosed above for the isolation regions 42. Typically, the capping layer 52 has a thickness from about 300 to about 700 angstroms.

The resistor 54 comprises a resistive material, but the resistor 54 is not necessarily intended as a fuse in accordance with the invention. Typically the resistor 54 is a generally lower resistance resistor that may comprise a generally conventional resistive material, such as a polysilicon resistive material. Typically, the resistor 54 has a thickness from about 200 to about 2000 angstroms.

FIG. 16 also shows a passivation layer 56 located passivating the transistors T and the resistor 54. The passivation layer 56 may comprise any of several passivation materials. The passivation materials may be selected from the same group of dielectric materials as the isolation regions 42. The passivation layer 56 may be formed using the same group of methods that are used for forming the isolation regions 42. Typically, the passivation layer 56 comprises at least in part a silicon oxide material that has a thickness from about 5000 to about 8000 angstroms.

FIG. 16 also shows a series of contact studs 58 located within a series of contact vias within the passivation layer 56. To fabricate these contact stud 58 structures within the semiconductor structure of FIG. 16, a blanket passivation layer precursor to the passivation layer 56 is first patterned to form the passivation layer 56. Subsequent to patterning to form the passivation layer 56, the contact studs 58 are then located and formed into the contact vias. Typically the contact studs 58 are formed using a blanket layer deposition and planarization method. The contact studs 58 may comprise any of several conductor materials. Included, but not limiting, are metals, metal alloys, doped polysilicon and polycide conductor materials. Particularly included are metals such as, but not limited to, tungsten, copper and aluminum metals, but the foregoing selections do not limit the embodiment or the invention. Tungsten metal is particularly common as a contact stud material.

FIG. 16 finally shows a dielectric passivation layer 60 that separates a plurality of interconnect layers 62. The passivation layer 60 may comprise materials, and be formed using methods, that are used for forming the passivation layer 56. Typically, the dielectric passivation layer 60 has a thickness from about 2000 to about 4000 angstroms.

The interconnect layers 62 may be formed using methods and materials generally analogous to the methods and materials used for forming the contact studs 58. A copper conductor metal is more common for forming an interconnect layer such as the interconnect layer 62. The interconnect layers 62 are typically fabricated using a blanket layer deposition and planarization method analogous to the blanket layer deposition and planarization method used for forming the contact studs 58.

Figure 17:
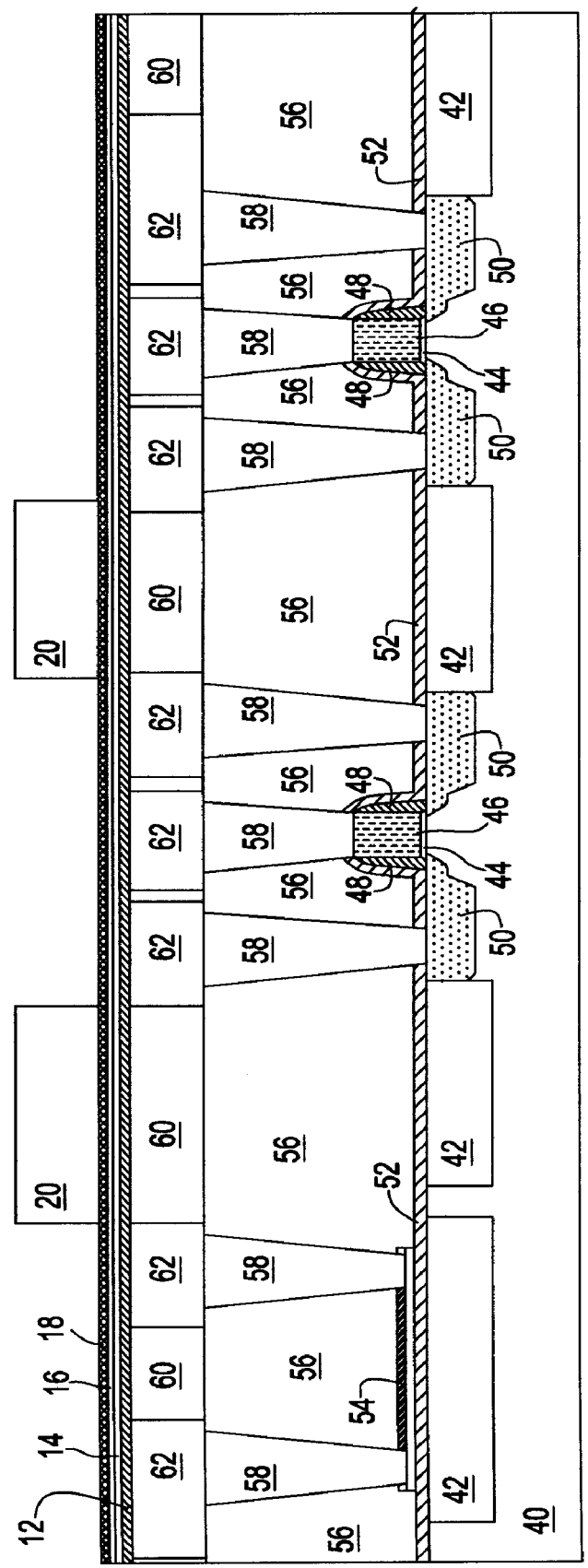
Figure 20:
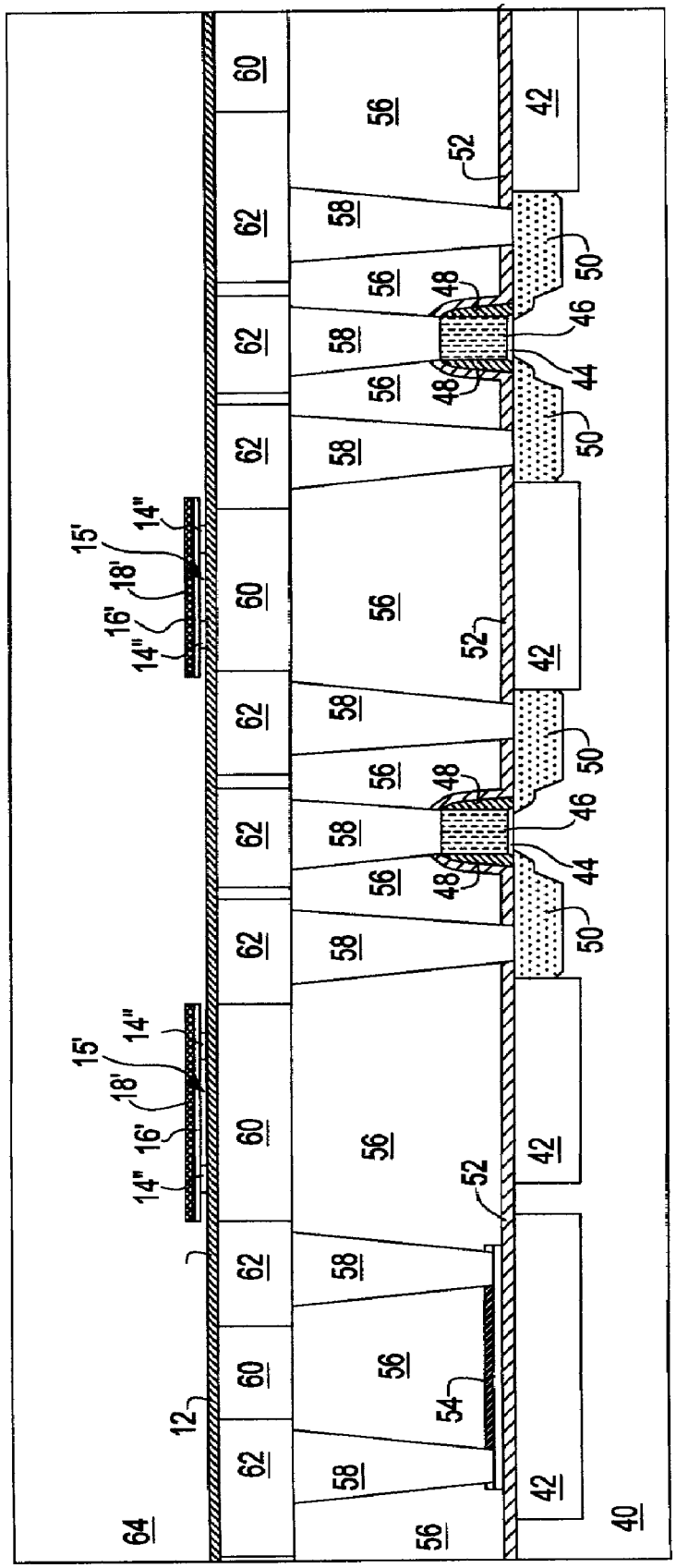

FIG. 17 shows a substrate layer 12 located upon the semiconductor structure of FIG. 16. FIG. 17 also shows a: (1) sacrificial layer 14 located upon the substrate layer 12; (2) a fuse material layer 16 located upon the sacrificial layer 14; and (3) a capping layer 18 located upon the fuse material layer 16. FIG. 20 finally shows a pair of mask layers 20 located upon the capping layer 18.

The substrate layer 12, the sacrificial layer 14, the fuse material layer 16, the capping layer 18 and the mask layers 20 are intended as representative of the like numbered layers within FIG. 1, within the context of materials of composition, thickness and methods of fabrication.

Figure 18:
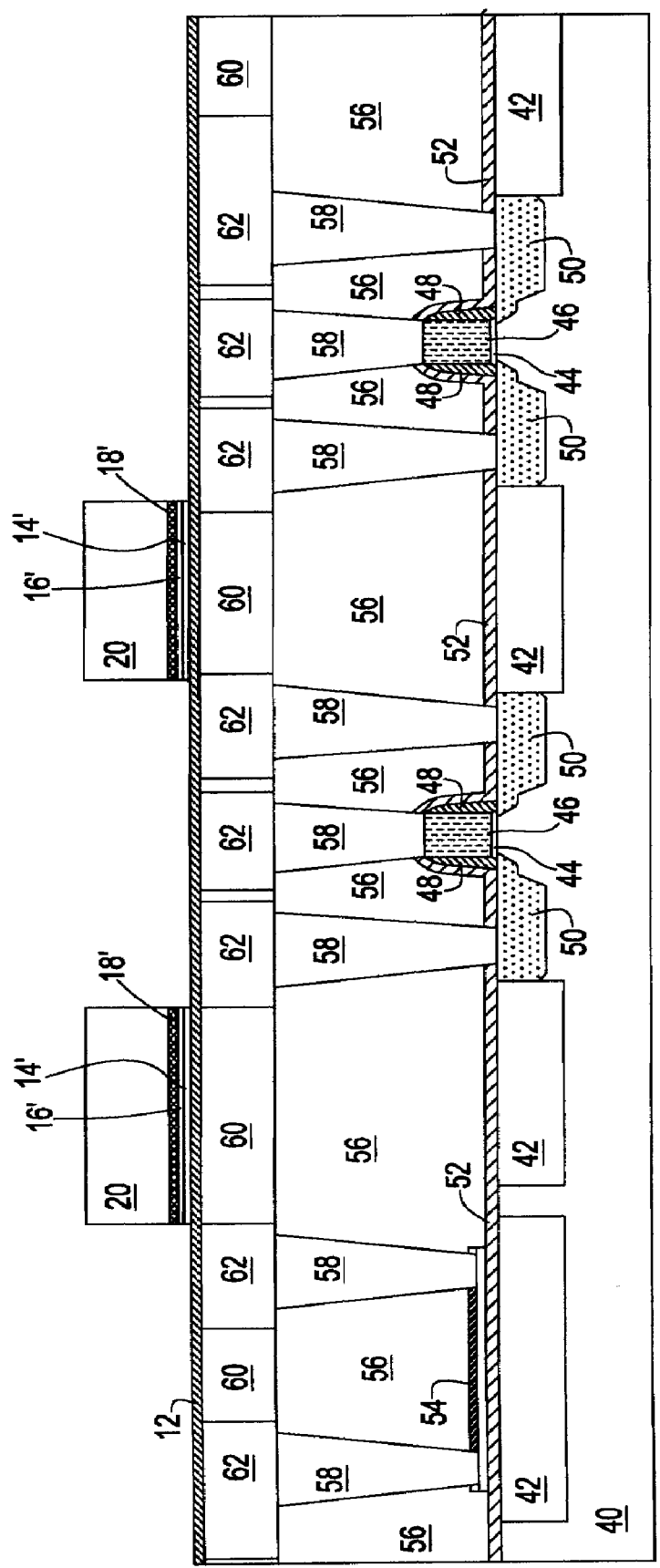

FIG. 18 shows the results of patterning the capping layer 18, the fuse material layer 16 and the sacrificial layer 14, while using the mask layers 20 as an etch mask.

The foregoing patterning corresponds with the patterning that is illustrated in FIG. 3 and FIG. 4. The foregoing patterning also yields the capping layers 18', the fuse material layers 16' and a sacrificial layers 14'.

Figure 19:
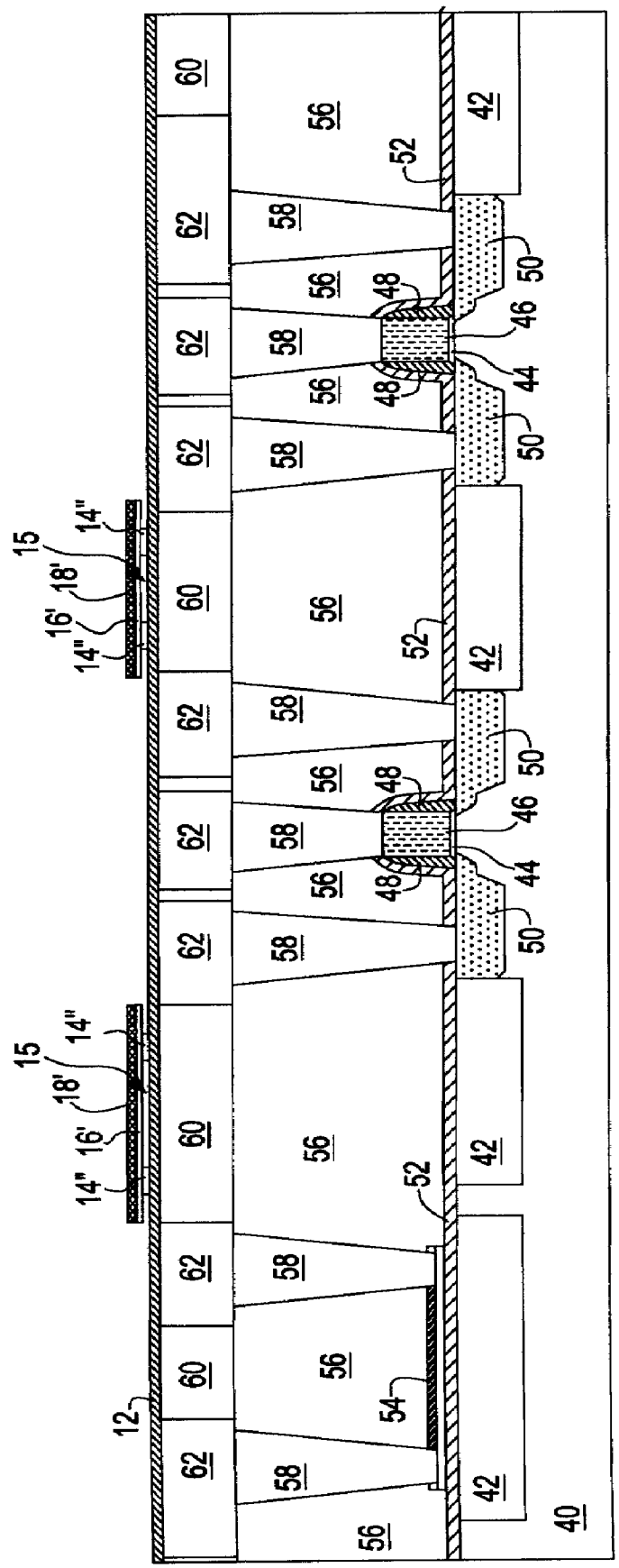

FIG. 19 shows the results of stripping the mask layers 20 and etching the sacrificial layers 14' to provide pairs of sacrificial layer pedestals 14" that are separated by voids 15.

The foregoing mask layer 20 stripping and sequential sacrificial layer 14' etching to provide the sacrificial layer pedestals 14" and voids 15 corresponds with fuse structure processing that is illustrated within FIG. 5 and FIG. 6.

FIG. 20 shows the results of forming an encapsulating dielectric layer 64 upon the semiconductor structure of FIG. 19.

The encapsulating dielectric layer 64 corresponds with the encapsulating dielectric layer 22 that is illustrated in FIG. 7 to FIG. 9. The encapsulating dielectric layer 64 provides for encapsulating the voids 15 to provide a pair of cavities 15'.

Figure 21:
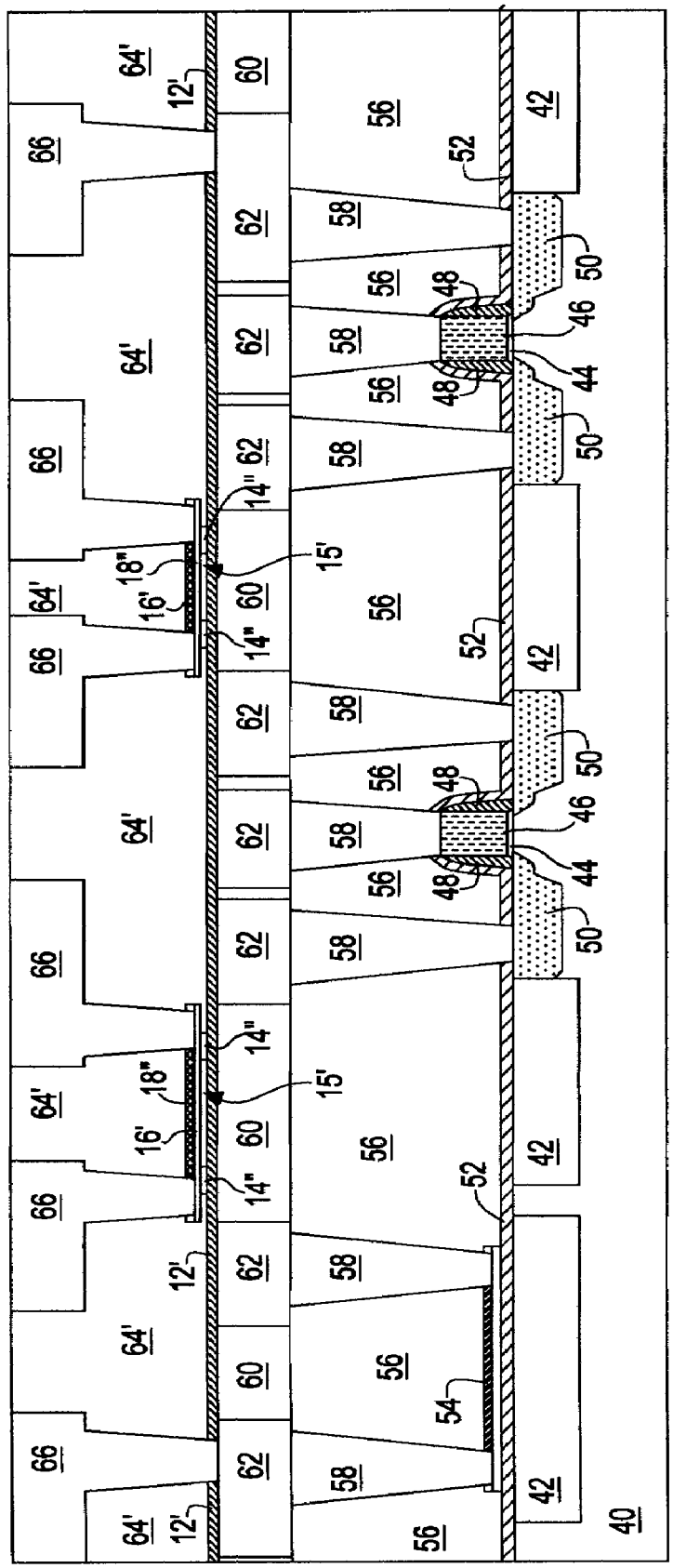

FIG. 21 first shows a series of dual damascene apertures located within an encapsulating dielectric layer 64' derived from the encapsulating dielectric layer 64 that is illustrated in FIG. 20. Some of the dual damascene apertures penetrate the substrate layer 12 to provide the substrate layer 12'. Other of the dual damascene apertures penetrates the capping layers 18' to provide the capping layers 18".

The dual damascene apertures may be formed using etch methods that are conventional in the semiconductor fabrication art. The methods may include methods that form vias first, as well as methods that form trenches first.

FIG. 21 also shows the results of forming contiguous conductor stud and conductor interconnect layers 66 into the dual damascene apertures.

The contiguous conductor stud and conductor interconnect layers 66 may comprise materials, have dimensions and be formed using methods analogous to the materials, dimensions and methods used for forming the contact studs 24 through the encapsulating dielectric layer 22 that is illustrated in FIG. 7 to FIG. 9.

FIG. 21 shows a fuse structure integrated into a semiconductor structure in accordance with an additional embodiment of the invention that comprises a third embodiment of the invention. The fuse structure corresponds with a fuse structure in accordance with the first embodiment that is illustrated in FIG. 7 to FIG. 9. To that end, the fuse structure includes a cavity 15' at one side, but not another side or sidewalls, of a fuse material layer 16'. The cavity 15' provides for enhanced thermal isolation and thus enhanced performance of the fuse material layer 16' when used as a fuse.

While the foregoing third embodiment corresponds with the first embodiment implemented in a fashion that is newly incorporated into a semiconductor structure, the invention also contemplates at least one additional embodiment where the fuse structure methodologically fabricated in accordance with the second embodiment is similarly also incorporated into a semiconductor structure.

The foregoing embodiments are illustrative of the invention rather than limiting of the invention. Revisions and modification may be made to methods, materials, structures and dimensions of a fuse structure in accordance with the foregoing embodiments, while still providing a fuse structure in accordance with the invention, further in accordance with the accompanying claims.

What is claimed is:

1. A method for forming a fuse structure comprising:

forming a laminated structure comprising a substrate layer, a sacrificial layer formed upon the substrate layer, a fuse material layer formed upon the sacrificial layer and a capping layer formed aligned upon the fuse material layer;

masking a pair of ends of the fuse material layer;

etching the sacrificial layer to form a pair of sacrificial layer pedestals at the pair of ends of the fuse material layer, said etching the sacrificial layer uses the capping layer and the fuse material layer as a self aligned mask;

unmasking the pair of ends of the fuse material layer;

forming an encapsulating dielectric layer over the fuse material layer and the sacrificial layer pedestals to form a cavity interposed between the fuse material layer and the substrate layer, said forming an encapsulating dielectric layer does not form a cavity on a side of the fuse material layer opposite the substrate layer.

* * * * *